US006773515B2

(12) United States Patent
Li et al.

(10) Patent No.: US 6,773,515 B2
(45) Date of Patent: Aug. 10, 2004

(54) FETA NANO-OXIDE LAYER AS A CAPPING LAYER FOR ENHANCEMENT OF GIANT MAGNETORESISTANCE IN BOTTOM SPIN VALVE STRUCTURES

(75) Inventors: Min Li, Fremont, CA (US); Simon H. Liao, Fremont, CA (US); Masashi Sano, Nagano (JP); Kiyoshi Noguchi, Nagano (JP); Kochan Ju, Fremont, CA (US); Cheng T. Horng, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 101 days.

(21) Appl. No.: 10/050,644

(22) Filed: Jan. 16, 2002

(65) Prior Publication Data

US 2003/0133232 A1 Jul. 17, 2003

(51) Int. Cl.[7] .................................. C23C 8/00
(52) U.S. Cl. ..................... 148/240; 148/281; 148/284; 29/603.14; 29/603.08; 29/603.15; 360/324.1; 360/324.2; 360/324.11; 360/324.12
(58) Field of Search ................. 148/240, 281, 148/284; 29/603.14, 603.08, 603.15; 360/324.1, 324.2, 324.11, 324.12

(56) References Cited

U.S. PATENT DOCUMENTS

| | | | |
|---|---|---|---|
| 5,637,235 A | 6/1997 | Kim et al. | 216/22 |
| 5,731,936 A | 3/1998 | Lee et al. | 360/113 |
| 6,175,476 B1 | 1/2001 | Huai et al. | 360/324.11 |
| 6,181,534 B1 | 1/2001 | Gill | 360/324.11 |
| 6,208,491 B1 | 3/2001 | Pinarbasi | 360/324.1 |
| 6,222,707 B1 | 4/2001 | Huai et al. | 360/324.1 |
| 6,268,985 B1 * | 7/2001 | Pinarbasi | 360/324.12 |

OTHER PUBLICATIONS

Swagten et al., "Specular Reflection in Spin Valves Bounded by NiO Layers," IEEE Trans. on Magnetics, vol. 34, No. 4, Jul., 1998, pp. 948–953.

Swagten et al., "Enhanced Giant Magnetoresistance in Spin–Valves Sandwiched Between Insulating NiO," Physical Review B, vol. 53, No. 14, Apr. 1, 1996, pp. 9108–9114.

Y. Kamiguchi et al., "CoFe Specular Spin Valve GMR Head Using NOL in Pinned Layer," Paper DB–01, Digest of Inter–magnetic Conference 1999 (no month data).

J.C.S. Kools, et al., "Magnetic Properties of Specular Spin–Valves Containing Nano–Oxide Layers," IEEE Trans. on Magnetics, vol. 37, No. 4, Jul., 2001, pp. 1783–1785.

Y. Huai et al., "Highly Sensitive Spin–Valve Heads with Specular Thin Oxide Capping Layers," Paper EB–14, Digest of MMM/Inter mag. 2001 Conf., p. 263 (no month data).

* cited by examiner

Primary Examiner—Andrew L. Oltmans
(74) Attorney, Agent, or Firm—George O. Saile; Stephen B. Ackerman

(57) ABSTRACT

A method for forming an NiCr seed layer based bottom spin valve sensor element having a synthetic antiferromagnet pinned (SyAP) layer and a capping layer comprising either a single specularly reflecting nano-oxide layer (NOL) or a bi-layer comprising a non-metallic layer and a specularly reflecting nano-oxide layer and the sensor element so formed. The method of producing these sensor elements provides elements having higher GMR ratios and lower resistances than elements of the prior art.

11 Claims, 1 Drawing Sheet

FIG. 1a – Prior Art

FETA NANO-OXIDE LAYER AS A CAPPING LAYER FOR ENHANCEMENT OF GIANT MAGNETORESISTANCE IN BOTTOM SPIN VALVE STRUCTURES

RELATED PATENT APPLICATION

This application is related to Ser. No. 10/037,812, filing date Jan. 4, 2002, assigned to the same assignee as the present invention.

BACKGROUND OF THE INVENTION

1. Field of the Invention

This invention relates generally to processes and materials used in the fabrication of a giant magnetoresistive (GMR) sensor, and more specifically to the use of a novel specularly reflecting nano-oxide layer (NOL) as a capping layer of a bottom spin valve sensor structure to improve its GMR ratio.

2. Description of the Related Art

One of the most commonly used structural configurations of magnetic and non-magnetic layers in giant magnetoresistive (GMR) read-heads is the so-called spin-valve magnetoresistive (SVMR) structure. In the most basic version of the SVMR, two ferromagnetic layers such as CoFe or NiFe are separated by a thin layer of electrically conducting but non-magnetic material such as Cu. One of the layers has its magnetization direction fixed in space or "pinned," by exchange coupling with an antiferromagnetic (AFM) layer, usually a layer of MnPt, directly deposited upon it. The remaining ferromagnetic layer, the unpinned or free layer, can rotate its magnetization vector in response to small variations in external magnetic fields such as are produced by moving magnetic media, (which variations do not affect the magnetization direction of the pinned layer). The rotation of one magnetization relative to the other produces changes in the resistance (magnetoresistance) of the three layer structure, the changes being dependent on the cosine of the angle between the two magnetization vectors. As a result of these resistance variations, a constant "sense" current sent through the SVMR produces voltage variations across it, which are sensed by external circuitry. This effect of magnetization directions on electrical resistance is a result of spin dependent electron scattering, wherein the orientation of the electronic spins of the electrons in the sense current relative to the magnetization of the layer directly affects their scattering cross-sections and, consequently, the resistance of the magnetic material. Newer versions of the spin valve configuration make use of a pinned layer which is a triply laminated layer comprising two ferromagnetic layers magnetically exchange coupled by a thin, non-magnetic "spacer" or "coupling" layer. The two ferromagnetic layers are coupled in a manner that has their respective magnetizations maintained in antiparallel directions by the antiferromagnetic pinning layer. This type of composite pinned layer is termed a "synthetic antiferromagnetic (SyAF) pinned layer," SyAP for brevity.

An older version of the use of variable magnetoresistance as a sensing tool was the anisotropic magnetoresistive (AMR) effect, wherein the resistance of a magnetic material was found to depend upon the angle between its magnetization and the direction of a current through it. The discovery of ways to enhance the magnetoresistive effect by the use of two layers of magnetic material (the spin valve) rather than one and by the methods used to form these layers (eg. the SyAF pinned layer), has led to what is now called the giant magnetorsistive (GMR) effect. It is this GMR which will be the subject of the present invention.

The major figure of merit for SVMR performance is its magnetoresistive ratio dR/R (usually expressed as a percentage), which is a measure of the maximum variation of its resistance that can be expected in operation. Improvements in the magnetoresistive ratio of a sensor element can be expected if the electrons in the sense current spend more time within the magnetically active portions of the sensor. For example, if the sensor element contains electrically conductive layers which do not directly contribute to the magnetoresistive effect (eg. they are not magnetic), then portions of the sense current may be shunted through these layers and not contribute to voltage variations across the sensor. It is now generally well accepted that a major contribution to the GMR effect is the presence of interfaces between various layers of the sensor elements. These interfaces produce specular reflection of the electrons, effectively removing mean-free-path limitations on electron scattering that would normally be placed on them by the external dimensions of the sensor. The realization of the importance of internal reflections on the magnetoresistive ratio, has produced great interest in the formation of sensor elements that exploit these interfacial scattering effects. For example, various types of capping layers, seed layers, buffer layers and nano-oxide layers (NOL) have been proposed as mechanisms for improving magnetorsistive ratios of sensor elements.

Huai et al. (U.S. Pat. No. 6,222,707 B1) teaches a method in which a seed layer is used to provide an improved texture for an antiferromagnetic layer grown upon it. The seed layer allows the growth of improved forms of antiferromagnetic pinning layers in bottom spin valves (spin valves in which the pinned layer is vertically beneath the free layer) thereby improving the exchange coupling between the pinning and pinned layers and, consequently, improving the magnetoresistive ratio.

Huai et al. (U.S. Pat. No. 6,175,476 B1) provides a bottom spin valve sensor having two antiparallel pinned layers coupled by a high resistivity rhenium layer that reduces shunt current through the three-piece pinned layer while still retaining adequate coupling between the two antiparallel layers. The sensor also includes a Ta capping layer whose purpose is to prevent oxidation of the sensor.

Gill (U.S. Pat. No. 6,181,534 B1) teaches a method for forming a magnetoresistive spin valve sensor element in which copper and nickel oxide specular relection layers are formed on each other and over a free magnetic layer.

Pinarbasi (U.S. Pat. No. 6,208,491 B1) teaches the formation of a capping structure comprising layers of CoFe and Ta or, alternatively CoFe, Cu and Ta, which improves the magnetoresistive performance subsequent to long periods of time at high temperatures.

Lee et al. (U.S. Pat. No. 5,731,936) teaches the formation of an MR sensor having a capping layer that can be either a Ta layer, an NiFeCr layer, an NiCr layer, an NiCr/Ta layer, or a Ta/NiCr layer. It is claimed that either the NiFeCr layer or the NiCr layer provide improved sensor thermal stability as compared to a single Ta capping layer.

Kim et al. (U.S. Pat. No. 5,637,235) provide a bottom spin valve sensor having a Ta capping layer of between 0–100 angstroms thickness to protect the upper surface of the top ferromagnetic layer.

The literature also contains reports of magnetoresistive ratio improvements as a result of the inclusion of novel materials and structures in the fabrication of sensors. In this regard, Swagten et al., in "Specular Reflections in Spin Valves Bounded by NiO Layers," IEEE Transactions on Magnetics, Vol. 34, No. 4, July 1998, pp. 948–953, report on achieving increased electron reflectivity by an insulating NiO layer that is used to exchange bias a spin valve. Swagten et al., in "Enhanced giant magnetoresistance in spin-valves sandwiched between insulating NiO," Phys. Rev. B, Vol. 53, No. 14, Apr. 1, 1966 also report on the enhanced GMR effects obtained when sandwiching Co/Cu/Co and $Ni_{80}Fe_{20}/Cu/Ni_{80}Fe_{20}$ between layers of NiO.

Y. Kamiguchi et al., in "CoFe Specular Spin Valve GMR Head Using NOL in Pinned Layer," Paper DB-01, Digest of Intermagnetic Conference 1999, report on a spin valve structure in which the pinned layer contains a nano-oxide layer (NOL) which enhances specular electron scattering.

T. Mizuguchi and H. Kano, in "Characteristics of spin-valve films with non-magnetic oxide layers for specular scattering," Paper EB-12, Digest of MMM/Intermag. 2001 conference, p. 263, report on a new spin valve structure in which the coercivity of the free layer remains low while the GMR properties are improved. In their structure, the free layer is separated by a Cu layer from a top TaO specularly reflecting capping layer and there is another specularly reflecting RuO layer incorporated within the pinned layer.

Y. Huai et al., in "Highly Sensitive Spin-Valve Heads with Specular Thin Oxide Capping Layers," Paper EB-14, Digest of MMM/Intermag. 2001 Conference, p. 263, discuss the specular reflection enhancing effects of thin oxide capping layers used in bottom synthetic specular spin-valve structures.

The present invention provides a method of improving the GMR ratio of a bottom spin-valve structure by the use of a novel NOL material layer as its capping layer.

SUMMARY OF THE INVENTION

It is an object of this invention is to provide a method for forming a bottom spin-valve sensor element having a higher GMR ratio and lower resistance than those formed by prior art methods.

It is a second object of this invention to provide a method of forming such a sensor that is capable of reading magnetic media on which the stored density is in the approximate range between 45 $Gb/in^2$ and 70 $Gb/in^2$.

In accord with this object, There is provided a method for forming a bottom spin valve sensor element having a synthetic antiferromagnetic (SyAF) pinned layer and based on a NiCr magnetoresistive enhancing seed layer, said method further comprising the formation of a novel, specularly reflecting FeTaO capping layer over the element.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figure, wherein:

FIGS. 1a, 1b and 1c are schematic cross-sectional views of a bottom spin-valve sensor formed in accord with the prior art (1a) and in accord with two embodiments of the method of the present invention (1b & 1c).

DESCRIPTION OF THE PREFERRED EMBODIMENTS

Figure 1B:
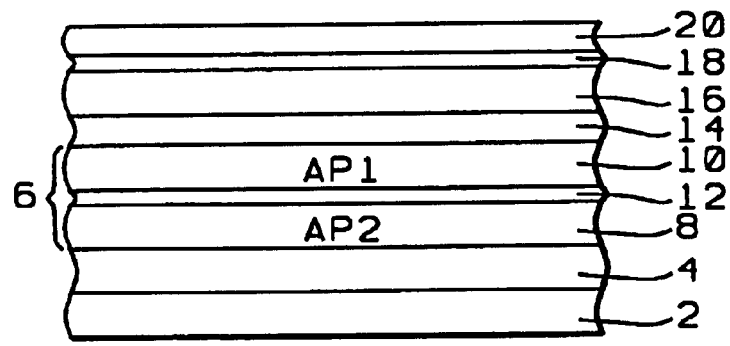
Figure 1B:
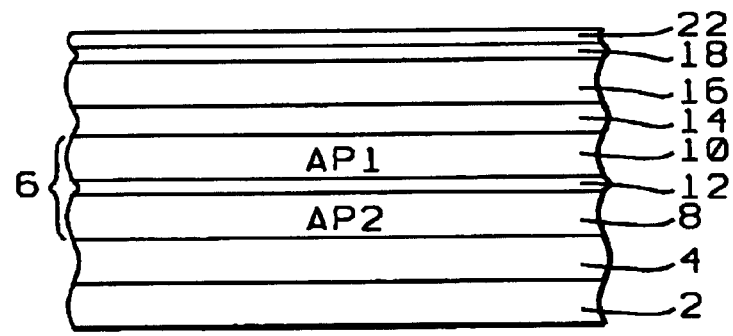

The present invention provides a method for fabricating a bottom spin-valve sensor element of high magnetoresistive ratio by forming a novel, specularly reflecting nano-oxide layer (NOL) as its capping layer.

Referring first to FIG. 1a, there is shown a schematic cross-sectional view of a typical prior art configuration of a bottom spin-filter element stack having a synthetic antiferromagnetic pinned (SyAP) layer and Ta capping layer. Compositionally, said stack has the form:

40A NiCr/130A MnPt/15A CoFe/8A Ru/20A CoFe/19A Cu/20A CoFe/5A Cu/8A Ta.

where "A" is angstroms.

As shown in FIG. 1a, the stack comprises an NiCr a seed layer (2) of approximately 40 angstroms thickness, an MnPt antiferromagnetic pinning layer (4) of approximately 130 angstroms thickness, a tri-layer formation of CoFe/Ru/CoFe (6), which is a synthetic antiferromagnetic pinned (SyAP) layer formed of two CoFe ferromagnetic layers (8) and (10), exchange coupled in mutually antiparallel magnetization directions through a Ru coupling layer (12) of approximately 8 angstroms thickness. CoFe layer (8) is denoted the second antiparallel layer, AP2, and is formed to a thickness of approximately 15 angstroms. CoFe layer (10) is denoted the first antiparallel layer, AP1, and is formed to a thickness of approximately 20 angstroms. The term "antiparallel" in this context refers to the mutually antiparallel directions of the magnetizations of the two pinned layers that corresponds to the low energy state between AP1 and AP2 when separated by the 8 angstrom Ru layer. The "second" layer referred to in this context is the one contiguous with the antiferromagnetic pinning layer (4), whereas the "first" layer (10) is the one contiguous with the subsequently deposited Cu spacer layer (14). Said Cu spacer layer (14) is a non-magnetic spacer layer of approximately 19 angstroms thickness, separating the pinned layer (6) from the free ferromagnetic layer (16), which is a CoFe layer deposited to a thickness of approximately 20 angstroms. A Cu layer (18) of approximate thickness 5 angstroms is formed on the free layer and serves as an oxidation barrier and a conducting layer. A Ta layer (20) of approximate thickness 8 angstroms is formed on the Cu layer. Layers (18) and (20) will be generally referred to as a capping formation for the sensor stack.

Referring next to FIG. 1b, there is shown a schematic cross-sectional view of one preferred embodiment of a new structure, compositionally described below, formed in accord with the method of the present invention.

40A NiCr/130A MnPt/15A CoFe/8A Ru/20A CoFe/19A Cu/20A CoFe/5A Cu/5A FeTa//OX.

As is shown schematically in FIG. 1b, the stack comprises a giant magnetoresistive (GMR) property enhancing NiCr (or NiFeCr) seed layer (2) of approximately 40 angstroms thickness on which is formed an MnPt antiferromagnetic pinning layer (4) of approximately 130 angstroms thickness. A tri-layer formation of CoFe/Ru/CoFe (6), which is a synthetic antiferromagnetic pinned (SyAP) layer formed of two CoFe ferromagnetic layers, (8), which is AP2 and (10), which is AP1, exchange coupled in mutually antiparallel magnetization directions through a Ru coupling layer (12) of approximately 8 angstroms thickness, is formed on the MnPt pinning layer. The AP1 and AP2 terminology is the same as that used in describing FIG. 1a. A Cu layer (14), which is a metallic, non-magnetic spacer layer of approximately 19 angstroms thickness, is formed on the AP1 (10) layer of the pinned layer, separating the pinned layer (6) from the free ferromagnetic layer (16), which is a CoFe layer deposited to a thickness of approximately 20 angstroms. A Cu layer (18) of approximate thickness 5 angstroms is formed on the free layer. On this Cu layer (18), there is then formed a specularly reflecting capping layer (NOL) of FeTaO (22) of approximately 5 angstroms thickness. The FeTaO capping layer is formed as an initially deposited FeTa layer which is approximately 95% Fe by number of atoms and approximately 5% Ta by number of atoms, which is subsequently oxidized to FeTaO in a PM5 TIM module under the preferred oxidation condition (OX):

OX: 5 sccm $O_2$ flow rate (0.05 mTorr)×10 sec.

It has also been determined that similar advantageous results are obtained when the oxidized FeTa layer is replaced by a similarly oxidized Fe or oxidized $(Fe_{65}Co_{35})_{97}V_3$ layer.

Subsequent to the formation of the element as above, the magnetizations of the various layers are established through a three step thermal anneal in the presence of external magnetic fields as follows:

1: 270° C./1 kOe/10 min., for the free layer, longitudinal field.
2: 270° C./8 kOe/3 hr., for the pinned layer, with the field being in the transverse direction.
3: 210° C./200 Oe/2 hr., for the free layer, longitudinal field.

Figure 1C:
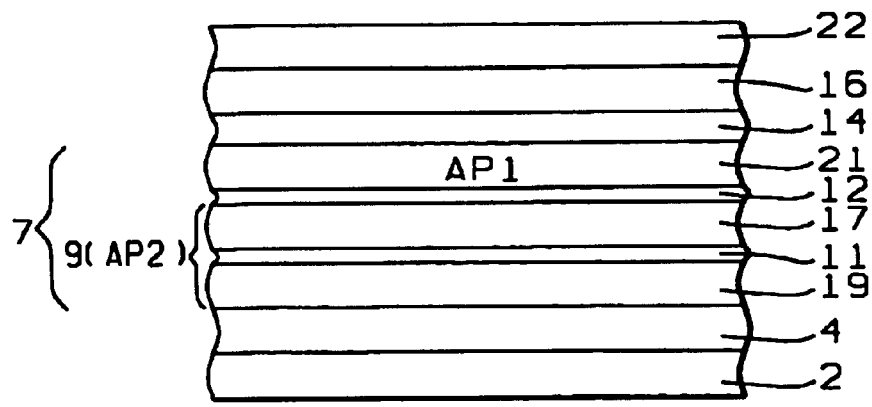

Referring finally to FIG. 1c, there is shown a schematic cross-sectional view of a second preferred embodiment of a new structure, compositionally described below, also formed in accord with the method of the present invention. 40A NiCr/100A MnPt/6.5A CoFe/Ta1A/6.5A CoFe/8A Ru/18A CoFe/19A Cu/20A CoFe/5A FeTa//OX.

As is shown schematically in FIG. 1c, the stack comprises a GMR property enhancing NiCr (or NiFeCr) seed layer (2) of approximately 40 angstroms thickness on which is formed an MnPt antiferromagnetic pinning layer (4) of approximately 100 angstroms thickness. A five-layer formation of CoFe/Ta1/CoFe/Ru/CoFe (7), which is a synthetic antiferromagnetic pinned (SyAP) layer, is formed on the MnPt layer. The synthetic pinned layer (7) comprises an AP2 layer (9), which is a first layer of CoFe (19) of approximately 6.5 angstroms thickness, on which is formed a Ta layer (11) of approximately 1 angstroms thickness which increases the resistance of the AP2 layer by current shunting and thereby increases the GMR ratio, on which Ta layer is formed a second layer of CoFe (17) of approximately 6.5 angstroms thickness. A Ru coupling layer (12) formed to a thickness of approximately 8 angstroms, separates the AP2 layer (9) from an AP1 layer (21), which is a layer of CoFe formed to a thickness of approximately 18 angstroms. A non-magnetic Cu spacer layer (14) is formed to a thickness of approximately 19 angstroms on the AP1 layer to separate it from the ferromagnetic free layer (16), which is a layer of CoFe formed to a thickness of approximately 20 angstroms. A specularly reflecting FeTaO (NOL) capping layer (22) is then formed on the ferromagnetically free layer. The FeTaO capping layer is formed as an initially deposited FeTa layer which is approximately 95% Fe by number of atoms and approximately 5% Ta by number of atoms, which is subsequently oxidized in a PM5 TIM module under the preferred oxidation condition (OX):

OX: 5 sccm $O_2$ flow rate (0.05 mTorr)×10 sec.

Subsequent to the formation of the element as above, the magnetizations of the various layers are established through a three step thermal anneal in the presence of external magnetic fields as follows:

1: 270° C./1 kOe/10 min., for the free layer, longitudinally directed field.
2: 270° C./8 kOe/3 hr., for the pinned layer, with the field being in the transverse direction.
3: 210° C./200 Oe/2 hr., for the free layer, longitudinally directed field.

Experiments performed on sensor stacks formed in accord with the methods of the prior art and on sensor stacks formed in accord with the method of the present invention show a distinct improvement in the magnetoresistive properties of the latter stacks as compared with the former. Table 1 below compares DR/R and DR for a reference prior art stack and stacks formed using the method of the present invention for each of the three oxidation processes described above.

TABLE 1

|   | DR/R (%) | DR (Ohm/sq) |
| --- | --- | --- |
| 1: NiCr40/MnPt130/CoFe15/Ru8/CoFe20/Cu19/CoFe20/Cu5/Ta8 | 16.95 | 3.02 |
| 2: NiCr40/MnPt130/CoFe15/Ru8/CoFe20/Cu19/CoFe20/Cu5/FeTa//OX | 17.75 | 3.04 |
| 3: NiCr40/MnPt130/CoFe15/Ru8/CoFe20/Cu18/CoFe20/Cu5/Ta8 | 17.59 | 3.21 |
| 4: NiCr40/MnPt130/CoFe15/Ru8/CoFe20/Cu18/CoFe20/Cu5/FeTa//OX | 18.08 | 3.15 |
| 5: NiCr40/MnPt100/CoFe6.5/Ta1/CoFe6.5/Ru8/CoFe18/Cu19/CoFe20/FeTa//OX | 19.38 | 3.86 |

All numerical values in the stack formations above are in angstroms. In table 1, samples 1 and 3 are standard reference bottom spin valves with Cu spacer layers of 19 A and 18 A thickness. Samples 2 and 4 are bottom spin valves made in accord with the method of the present invention wherein a specularly reflecting capping layer of FeTaO is added. It can be seen from the table that the FeTaO capped samples display greatly improved values of DR/R and DR. Sample 5 displays the greatest improvement in DR/R and DR. It has also been experimentally verified that the sheet resistance of samples 2 and 4 is less than that of samples 1 and 3. Sample 5 differs from samples 2 and 4 in that samples 2 and 4 interpose a Cu layer between the CoFe free layer and the FeTaO capping layer, whereas sample 5 does not have such a Cu layer. Additionally, sample five interposes an approximately 1 angstrom thick layer of Ta as a resistance increasing layer within the AP2 layer which contributes to the GMR ratio improvement of that sample. We conclude that the CoFe/FeTaO interface provides better specularity than the CoFe/Cu/FeTaO interface. It should also be noted that reducing the Cu spacer thickness from approximately 19 angstroms (sample 2) to approximately 18 angstroms (sample 4) provided an improvement in sample 4 as compared to sample 2. Reducing the Cu layer thickness in the reference samples, 1 and 3, also appears to provide an improvement, but it was shown experimentally that the thinner Cu layer in the reference sample increased the interlayer coupling field to a value that was unsuitable for device applications.

As is understood by a person skilled in the art, the preferred embodiment of the present invention is illustrative of the present invention rather than limiting of the present invention. Revisions and modifications may be made to methods, materials, structures and dimensions employed in practicing the method of the present invention, while still remaining in accord with the spirit and scope of the present invention as defined by the appended claims.

What is claimed is:

1. A method for forming a bottom spin valve magnetoresistive sensor element comprising:

providing a substrate;

forming on the substrate a magnetoresistive-property-enhancing seed layer;

forming on said seed layer a pinning layer of antiferromagnetic material;

forming on said pinning layer a synthetic antiferromagnetic pinned (SyAP) layer, said formation further comprising:

forming on said pinning layer a second antiparallel (AP2) pinned layer of ferromagnetic material;

forming on said second antiparallel (AP2) pinned layer a non-magnetic coupling layer; and forming on said non-magnetic coupling layer a first antiparallel (AP1) pinned layer to complete said SyAP layer;

forming on said first antiparallel (AP1) layer of said SyAP layer a non-magnetic spacer layer;

forming on said non-magnetic spacer layer a ferromagnetic free layer;

forming on said ferromagnetic free layer a double-layer capping layer, said capping layer comprising a first layer of non-magnetic material on which is formed a second layer of the specularly reflecting material oxidized FeTa, oxidized Fe or oxidized $(Fe_{65}Co_{35})_{97}V_3$;

thermally annealing said sensor element at a prescribed succession of temperatures in the presence of a corresponding sequence of external magnetic fields, establishing, thereby, the magnetizations of said free and said pinned magnetic layers.

2. The method of claim 1 wherein the non-magnetic material layer of the capping layer is a layer of non-magnetic material chosen from the group consisting of Cu, Ag, Au, Rh and Ru.

3. The method of claim 2 wherein the non-magnetic material layer of the capping layer is a layer of Cu formed to a thickness of between approximately 0 and 20 angstroms.

4. The method of claim 1 wherein the specularly reflecting layer of the capping layer is a layer of FeTaO formed to a thickness of between approximately 5 and 40 angstroms.

5. The method of claim 4 wherein the specularly reflecting layer of FeTaO is formed by an oxidation process applied to a layer of FeTa deposited on said non-magnetic material layer to a thickness of between approximately 3 and 30 angstroms.

6. The method of claim 5 wherein said layer of deposited FeTa is a layer which is approximately 95% Fe by number of atoms and approximately 5% Ta by number of atoms.

7. The method of claim 6 wherein said oxidation process is carried out in a PM5 TIM module in which there is supplied molecular oxygen at a flow rate of between approximately 5 and 50 sccm, a pressure of between approximately 0.05 and 0.5 mTorr for a time duration of between approximately 9 and 11 seconds, but where approximately 10 seconds is preferred.

8. The method of claim 1 wherein said specularly reflecting capping layer of oxidized Fe or oxidized $(Fe_{65}Co_{35})_{97}V_3$ is formed to a thickness of between approximately 5 and 40 angstroms.

9. The method of claim 8 wherein said oxidation process is carried out in a PM5 TIM module in which there is supplied molecular oxygen at a flow rate of between approximately 5 and 50 sccm, a pressure of between approximately 0.05 and 0.5 mTorr for a time duration of between approximately 9 and 11 seconds, but where approximately 10 seconds is preferred.

10. A method for forming a bottom spin valve magnetorestive sensor element comprising:

providing a substrate;

forming on the substrate a magnetoresistive-property-enhancing seed layer;

forming on said seed layer a pinning layer of antiferromagnetic material;

forming on said pinning layer a synthetic antiferromagnetic pinned (SyAP) layer, said formation further comprising:

forming on said pinning layer a second antiparallel (AP2) pinned layer of ferromagnetic material;

forming on said second antiparallel (AP2) pinned layer a non-magnetic coupling layer; and forming on said non-magnetic coupling layer a first antiparallel (AP1) pinned layer to complete said SyAP layer;

forming on said first antiparallel (AP1) layer of said SyAP layer a non-magnetic spacer layer;

forming on said non-magnetic spacer layer a ferromagnetic free layer;

forming on said ferromagnetic free layer a capping layer of the specularly reflecting material oxidized FeTa;

thermally annealing said sensor element at a prescribed succession of temperatures in the presence of a corresponding sequence of external magnetic fields, establishing, thereby, the magnetizations of said free and said pinned magnetic layers.

11. The method of claim 10 wherein said specularly reflecting capping layer is a layer of FeTaO formed to a thickness of between approximately 5 and 40 angstroms.

* * * * *